US007915165B2

(12) United States Patent
Ozaki et al.

(10) Patent No.: US 7,915,165 B2
(45) Date of Patent: Mar. 29, 2011

(54) SUBSTRATE TREATING APPARATUS AND METHOD FOR MANUFACTURING SEMICONDUCTOR DEVICE

(75) Inventors: Takashi Ozaki, Tokyo (JP); Kenichi Suzaki, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/662,384

(22) Filed: Apr. 14, 2010

(65) Prior Publication Data
US 2010/0201055 A1    Aug. 12, 2010

Related U.S. Application Data

(63) Continuation of application No. 10/517,765, filed as application No. PCT/JP03/08097 on Jun. 26, 2003, now Pat. No. 7,737,034.

(30) Foreign Application Priority Data

Jun. 27, 2002   (JP) ................................. 2002-187566
Mar. 26, 2003   (JP) ................................. 2003-084774

(51) Int. Cl.
  *H01L 21/44*       (2006.01)
(52) U.S. Cl. ........................... 438/680; 269/21; 269/903
(58) Field of Classification Search .................. 438/680; 269/21, 903
   See application file for complete search history.

(56) References Cited

U.S. PATENT DOCUMENTS

| 6,099,302 A | 8/2000 | Hong et al. | ................... 432/259 |
| 6,872,636 B2 | 3/2005 | Moriya et al. | ................ 438/479 |

FOREIGN PATENT DOCUMENTS

| JP | 06-045333 | 2/1994 |
| JP | 07-109574 | 4/1995 |
| JP | 11-003866 | 1/1999 |
| JP | 11-186247 | 7/1999 |
| JP | 2000-91406 | 3/2000 |
| JP | 2000-106349 | 4/2000 |
| JP | 2000-182979 | 6/2000 |
| JP | 2002-217275 | 8/2002 |

OTHER PUBLICATIONS

International Search Report for PCT/JP03/08097 mailed Oct. 7, 2003 (2 pages).
Communication from the Japanese Patent Office mailed Oct. 19, 2010 with English translation (6 pages).

*Primary Examiner* — Matthew C Landau
*Assistant Examiner* — Sonya D McCall Shepard
(74) *Attorney, Agent, or Firm* — Kratz, Quintos & Hanson, LLP

(57) ABSTRACT

A support section (28) for supporting a wafer (1) is convexly formed in the center of a receiving section (26) of a support groove (25) of a boat 21. At the time of boat loading of the boat (21), in which wafers (1) respectively received by the supporting sections (28) are aligned, from a standby chamber (33) to a processing chamber (14), the pressure in the standby chamber (33) and processing chamber (14) is set to 200 pascals or more, and 3000 pascals or less. By supporting the wafer upwards from the receiving section with use of the support section, even if peeling of the film on the wafer occurs from a large frictional force between the supported surface of the wafer and the support section under a reduced pressure, the particles from the peeling are caught by the receiving section and therefore particles are prevented from adhering to the IC fabrication surface of the wafer directly below the receiving section.

15 Claims, 12 Drawing Sheets

FIG.2a
FIG.2b
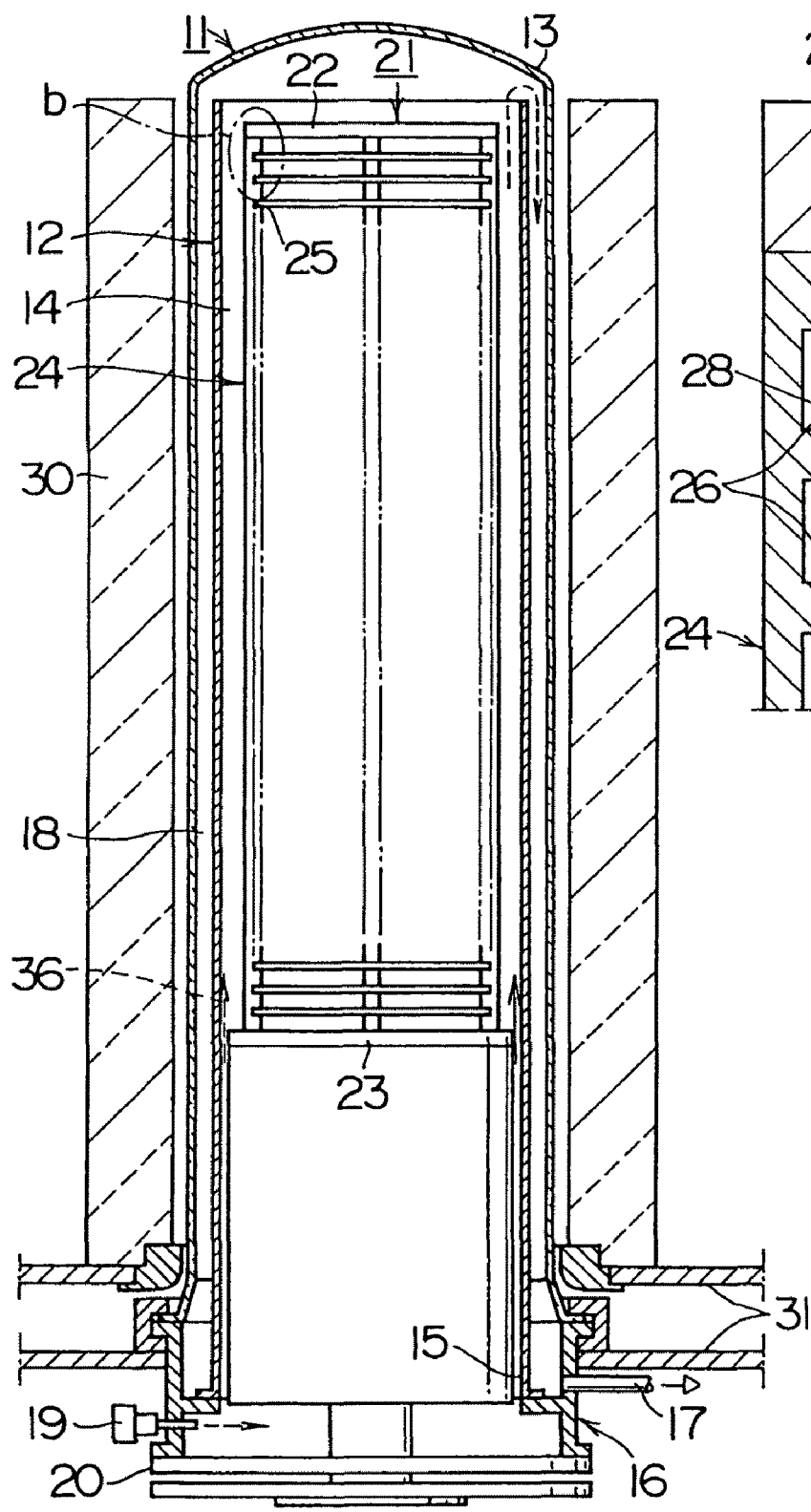
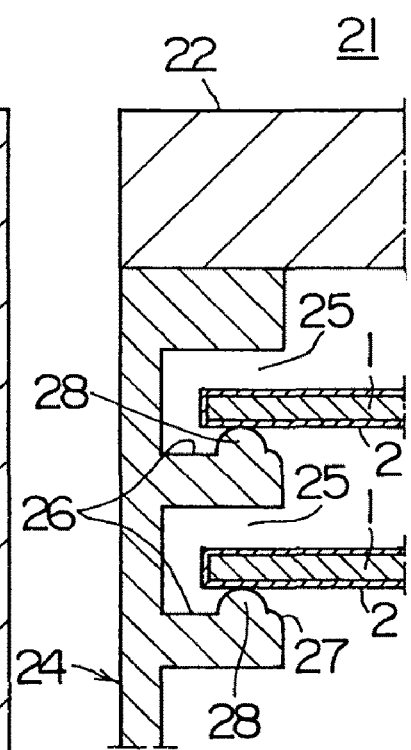

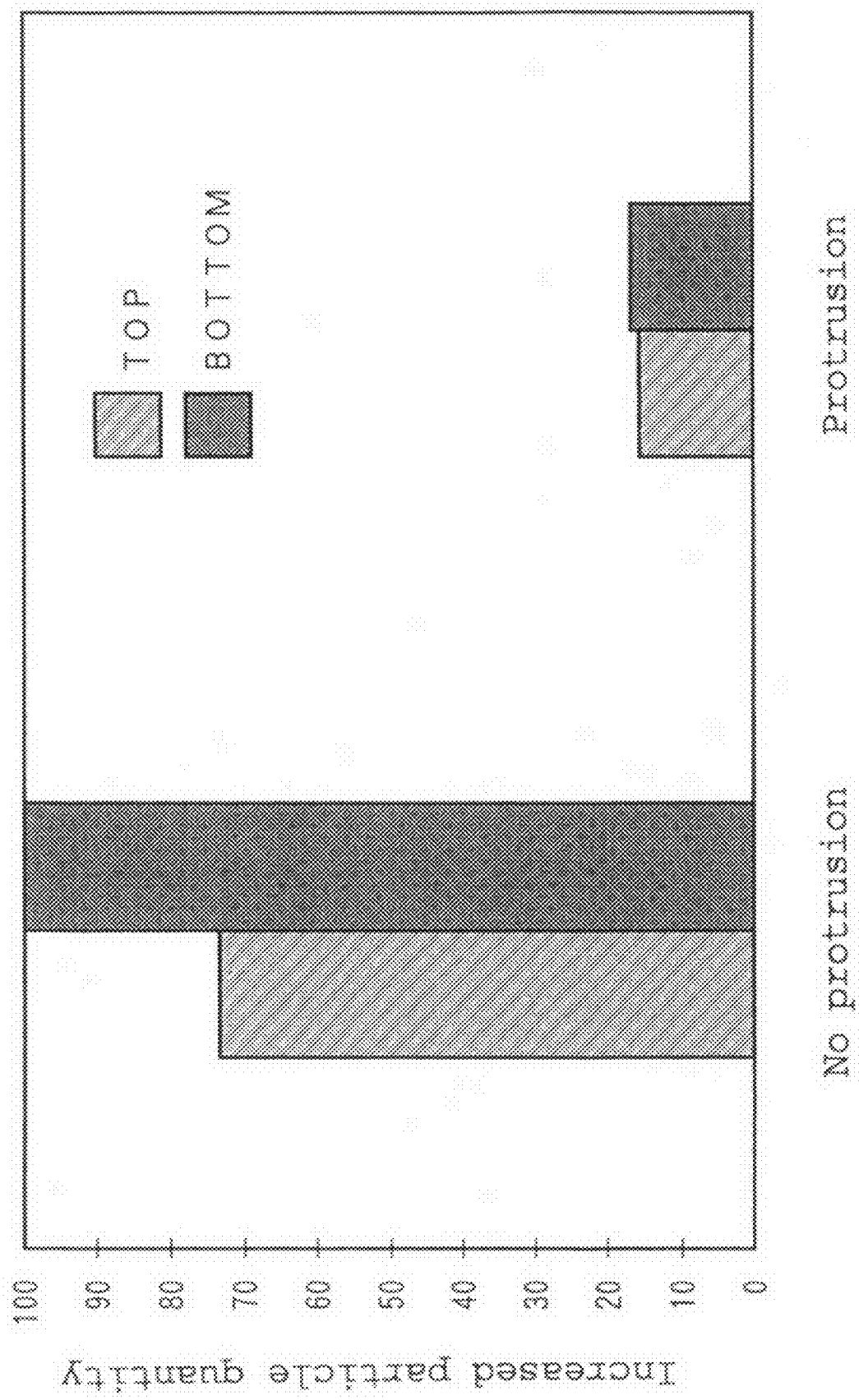

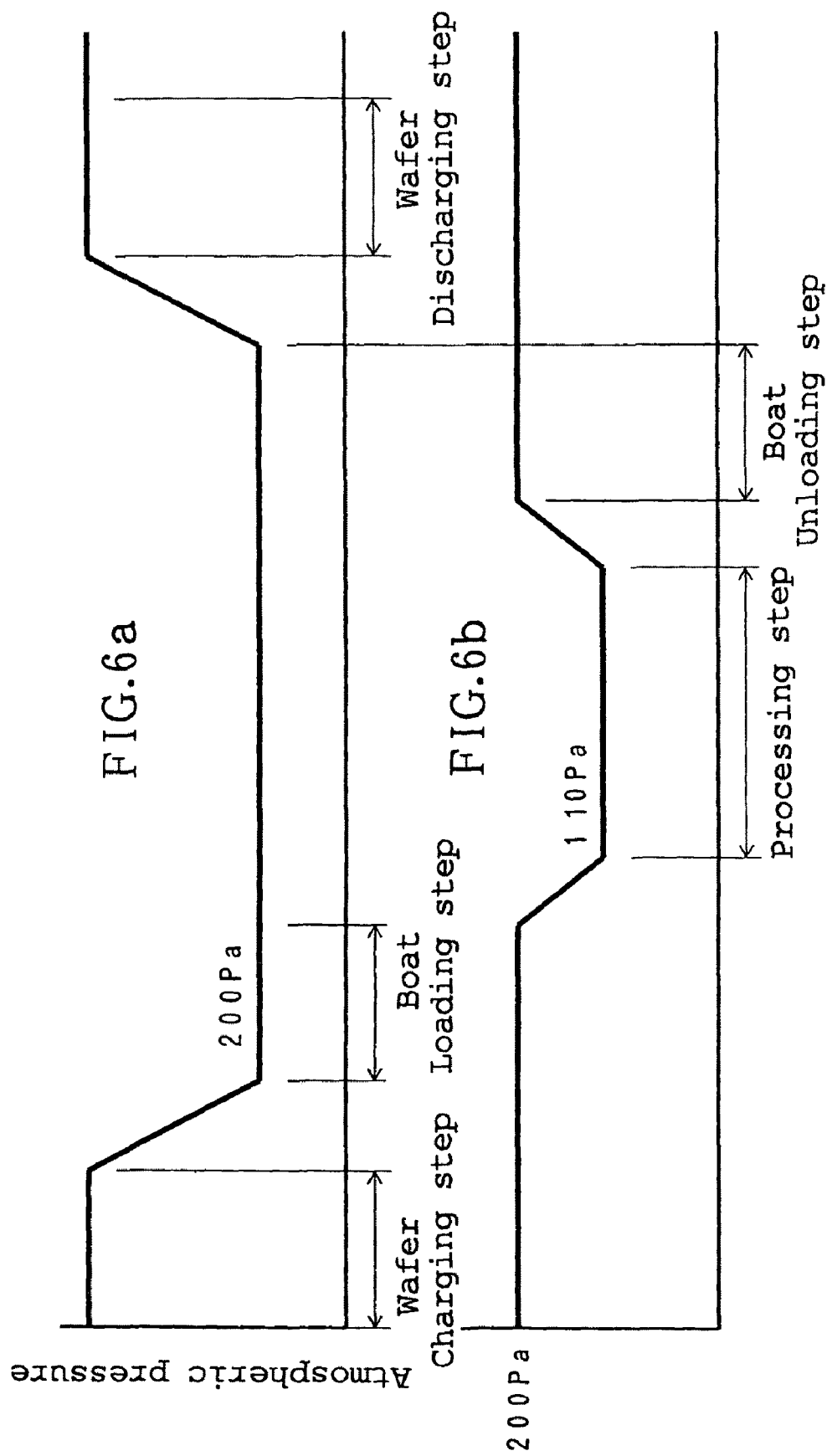

SUBSTRATE TREATING APPARATUS AND METHOD FOR MANUFACTURING SEMICONDUCTOR DEVICE

RELATED APPLICATIONS

This application is a continuation of U.S. application Ser. No. 10/517,765, filed Feb. 3, 2006, now U.S. Pat. No. 7,737,034 which application is a 371 of PCT Application No. PCT/JP03/08097, filed Jun. 26, 2003, which application claims priority of Japanese Application Nos. 2002-187566, filed Jun. 27, 2002 and 2003-084774, filed Mar. 26, 2003, all of which are incorporated herein by reference.

TECHNICAL FIELD

The present invention relates to a substrate treating apparatus and a method for manufacturing semiconductor devices, and relates in particular to a method for manufacturing semiconductor integrated circuit devices (hereafter called IC), for example for technology effective in processes for depositing doped-polysilicon film or nondoped-polysilicon film, silicon nitride ($Si_3N_4$) or silicon oxide (SiOx) films with a thermal CVD apparatus on semiconductor wafer (hereinafter called wafer) for fabricating integrated circuits containing semiconductor devices.

BACKGROUND ART

The batch mode vertical hot-wall depressurization CVD apparatus is widely used in IC manufacturing methods in processes for depositing CVD films such as doped-polysilicon film or nondoped-polysilicon film, silicon nitride or silicon oxide films on wafers. The batch mode vertical hot-wall depressurization CVD apparatus (hereafter CVD apparatus) is made up of a vertically installed process tube comprised of an inner tube for containing the wafer and an outer tube enclosing the inner tube, a gas supply tube to feed a film-forming gas in the processing chamber formed by the process tube, an exhaust tube for evacuating gas for a vacuum from the processing chamber, a heater unit installed outside of the process tube for heating the processing chamber, a boat for loading and unloading of multiple wafers into and out of the processing chamber while holding on a multiple step support groove, and a standby chamber for maintaining the boats in standby status for loading and unloading to the processing chamber. After multiple wafers are loaded (wafer charging) into the boat in the standby chamber, the boat is loaded (boat loading) from the standby chamber into the preheated processing chamber, and along with film-forming gas being supplied from the gas supply tube to the processing chamber, the processing chamber is heated to the specified temperature by the heater unit so that a CVD film is deposited on the wafer (see for example Patent document 1).

Boat loading methods for these type of CVD apparatus of the prior art include a boat loading method wherein the processing chamber and the standby chamber are both at atmospheric pressure; a boat loading method wherein the air in the processing chamber and the standby chamber are both purged by nitrogen ($N_2$) gas; and a boat loading method wherein the processing chamber and the standby chamber are evacuated to a vacuum. The boat loading method wherein the processing chamber and the standby chamber are both at atmospheric pressure, tends to easily develop a natural oxidized film during boat loading and therefore has the problem that the oxidized film has adverse effects on the productivity of the IC manufacturing method. The boat loading method wherein the air in the processing chamber and the standby chamber are both purged by nitrogen gas successfully suppresses development of the natural oxidized film compared to the method for boat loading at atmospheric pressure, however oxygen ($O_2$) cannot be completely eliminated from the nitrogen gas so that the natural oxidized film increases to a certain extent. The boat loading method wherein the processing chamber and the standby chamber are evacuated to a vacuum can eliminate virtually all of the oxygen so that an increase in the natural oxidized film is suppressed compared to the method for boat loading under a nitrogen gas environment.

However it was discovered that particles are generated in boat loading that evacuates the processing chamber and the standby chamber to a vacuum. In other words, during boat loading of wafers into the preheated processing chamber, the wafer temperature rises from the periphery on the side near the heater, and rises slower in the center section on the far side from the heater creating a temperature differential. Due to the relation between this temperature differential within the wafer and the wafer's own weight, the wafer is known to curve into a concave shape. Along with this curvature of the wafer, the support surface of the wafer support groove on the boat and the supported surface on the periphery on the lower surface of the wafer rub against each other. When the processing chamber and the standby chamber are evacuated to a vacuum at this time, the frictional force between the boat support surface and the wafer supported surface becomes large so that the film deposited on the lower surface of the wafer in the previous process is peeled away. The film that was peeled away becomes particles and spills downwards from the support surface of the support groove. These particles falling directly downward adhere to upper surface of the wafer where the IC is fabricated and therefore badly affect the productivity in the IC manufacturing method.

The present invention therefore has the object of providing a substrate treating apparatus and a method for manufacturing semiconductor devices capable of preventing a drop in production due to particles from the supported surface of the substrate under decompression.

DISCLOSURE OF INVENTION

The present invention is a substrate treating apparatus comprising a processing chamber for processing at least one substrate, and a substrate support member for supporting at least one substrate, a prechamber for storing this substrate support member, and a control device for regulating the pressure to a pressure lower than atmospheric pressure during loading from a prechamber into the processing chamber of the substrate support member supporting at least one substrate, wherein the substrate support member contains a support section to be contacted the substrate, and a receiving section installed below the support section and extending outwards from a section of the outer periphery of the support section. In this substrate treating apparatus, even if friction occurs between the supported surface of the substrate and the support section of the substrate support member causing peeling of the substrate film, the particles generated from the peeling are caught by the receiving section and therefore prevented from dropping onto the substrate so that a decline in substrate production due to peeling of the film on the substrate can be prevented.

A method for manufacturing semiconductor devices comprises a step for supporting at least one substrate on a substrate support member containing a support section to be contacted at least one substrate, and a receiving section installed below the support section and extending outwards from a section of the outer periphery of the support section; a step for loading the substrate support member supporting at least one substrate at a pressure lower than atmospheric pressure into the processing chamber; and a step to process at least one substrate supported by the substrate support member in the processing chamber. In this manufacturing method for semiconductor devices, even if friction occurs between the supported surface of the substrate and the support section of the substrate support member causing the substrate film to peel, the particles generated from the peeling are caught by the receiving section and therefore prevented from dropping onto the substrate so that a decline in production due to peeling of the film on the substrate can be prevented.

BRIEF DESCRIPTION OF DRAWINGS

FIGS. 2a and 2b are drawings of an essential portion after the boat loading step; FIG. 2a is a frontal cross sectional view; FIG. 2b is an enlarged cross sectional view of the b section in FIG. 2a.

FIG. 4 is a graph showing the interrelation between the shape of the support surface and the increased quantity of particles.

FIG. 5a is a drawing showing the case when there is no protrusion; FIG. 5b is a drawing showing the case when there is a protrusion.

FIGS. 6a and 6b are timing charts showing the pressure in the film forming process of the IC manufacturing method of the first embodiment of the present invention.

FIG. 11a shows the example of the prior art; FIG. 11b shows the present embodiment.

FIG. 12a is a perspective view; FIG. 12b is a plan cross sectional view; and FIG. 12c is a frontal cross sectional view.

BEST MODE FOR CARRYING OUT THE INVENTION

The first embodiment of the present invention is described next while referring to the accompanying drawings.

Figure 1:
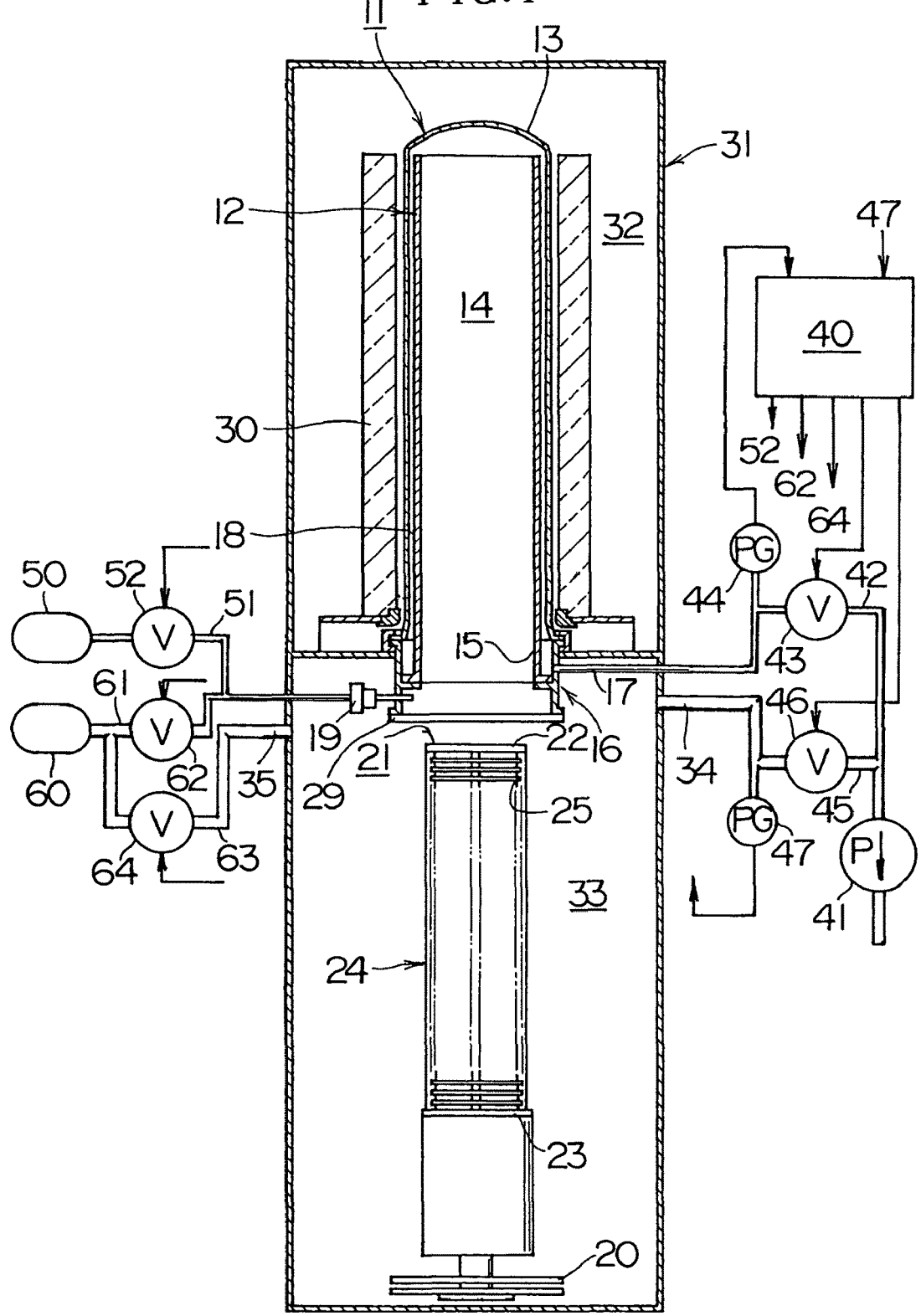
FIG. 1 is a frontal cross sectional view showing the CVD apparatus of the first embodiment of the present invention.

In the present embodiment, the film-forming process of the manufacturing method for the semiconductor device of the present invention is implemented by the CVD apparatus (batch mode vertical hot-wall depressurization CVD apparatus) shown in FIG. 1 and FIG. 2. The CVD apparatus shown in FIG. 1 and FIG. 2 contains a vertical process tube 11 disposed vertically with the vertical center line and fixedly supported. This process tube 11 is made up of an inner tube 12 and an outer tube 13. The inner tube 12 is made of quartz ($SiO_2$) or silicon carbide (SiC) and formed in a cylindrical shape. The outer tube 13 is made of quartz or silicon carbide and formed in a cylindrical shape. The inner tube 12 is formed with openings at the top and bottom ends formed in a cylindrical shape. A processing chamber 14 is formed in a hollow part of the inner tube 12 for the multiple wafers carried in while held in a perpendicular array by the boat. A furnace inlet 15 is formed at the lower end opening of the inner tube 12 for loading and unloading of wafers as the substrates for processing. The inner diameter of the inner tube 12 is therefore set to a size larger than the maximum outer diameter of the wafers being handled. The outer tube 13 is formed in a cylindrical shape with the top end sealed and the bottom end open and with the inner diameter larger than the outer diameter of the inner tube 13. The outer tube 13 is formed concentrically to enclose the outer side of the inner tube 12. A manifold 16 is formed in a ring shape between the bottom end of the inner tube 12 and the bottom end of the outer tube 12 for air-tight sealing. The manifold 16 is supported by a casing 31 of the CVD apparatus so that the process tube 11 is perpendicularly installed. The bottom end opening of the manifold 16 is opened and closed by a furnace opening gate valve 29.

An exhaust pipe 17 is connected on the upper section of the side wall of the manifold 16 by way of an exhaust line 42 to an exhaust device 41 made up of a vacuum pump. A flow rate controller valve 43 and a pressure meter 44 are installed on the exhaust line 42. The flow rate controller valve 43 is controlled by a control device 40. The pressure meter 44 sends the measurement results to the control device 40. The exhaust pipe 17 connects to an exhaust path 18 formed from the gap formed between the inner tube 12 and the outer tube 13. The cross sectional shape of the exhaust path 18 is formed in a circular ring shape with a fixed width by the gap between the inner tube 12 and the outer tube 13. The exhaust pipe 17 is connected to the manifold 16 and therefore installed at the lowermost end of the exhaust path 18. A gas supply pipe 19 on the lower section of the side wall of the manifold 16, connects to the furnace inlet 15 of the inner tube 12. A film-forming gas supply source 50 and a nitrogen gas supply source 60 are respectively connected to the gas supply pipe 19 by a film-forming gas supply line 51 and the nitrogen gas supply line 61. A film-forming gas flow rate control valve 52 and a nitrogen gas flow rate control valve 62 respectively controlled by the control device 40 are each installed on the film-forming gas supply line 51 and the nitrogen gas supply line 61. Gas supplied to the furnace inlet 15 by the gas supply pipe 19, passes through the processing chamber 14 of the inner tube 12, passes along the exhaust path 18 and is exhausted by the exhaust pipe 17. A seal cap 20 at the bottom edge of the manifold 16 that seals the processing chamber 14 makes contact from the lower side. The seal cap 20 is formed in a disk shape roughly equivalent to the outer diameter of the manifold 16, and is raised or lowered perpendicularly by the boat elevator (not shown in drawing).

Figure 3:
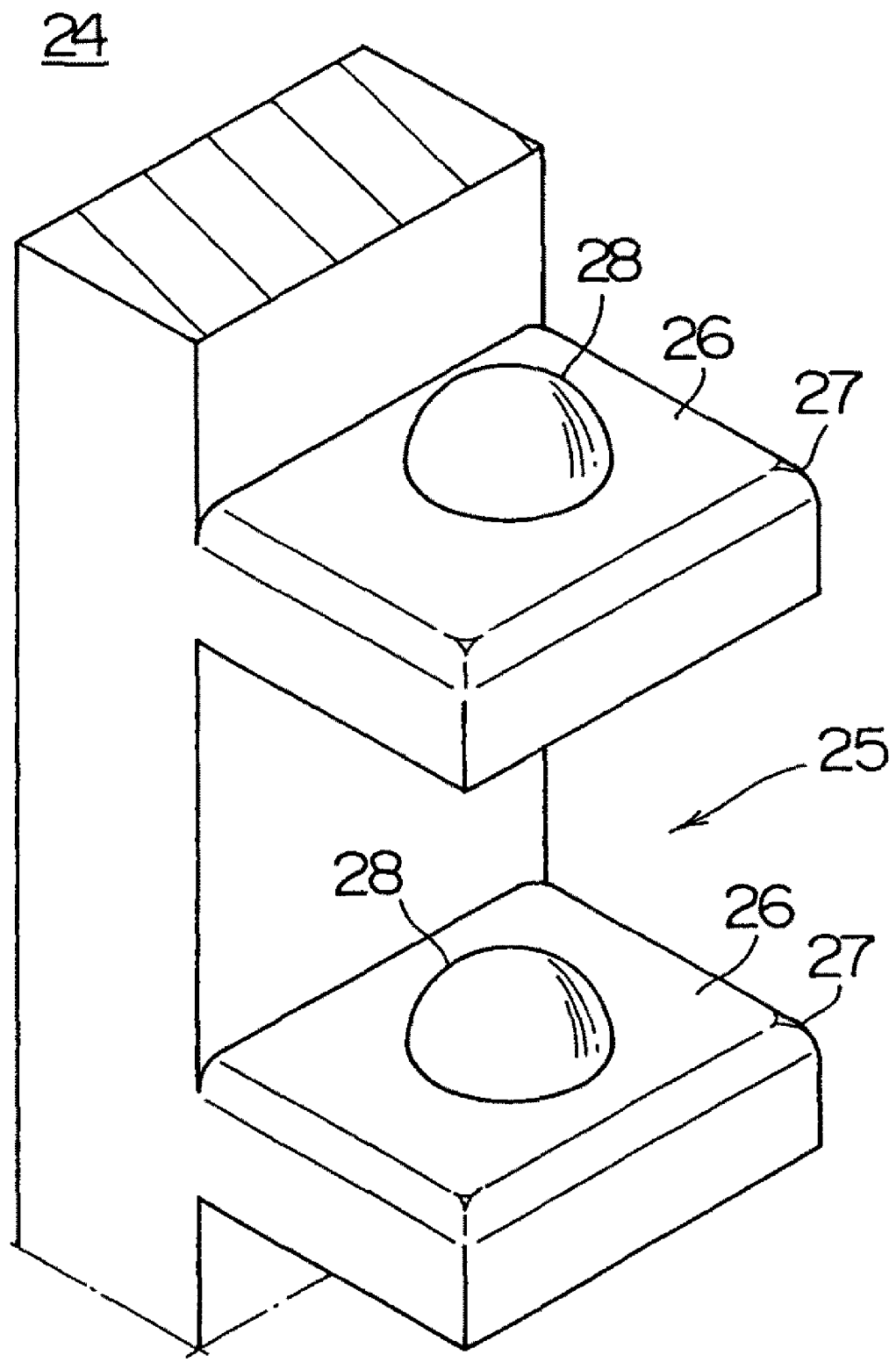
FIG. 3 is a perspective view showing the support groove of the boat.

A boat 21 for supporting a wafer 1 as the substrate for processing is supported upright on the center line of the seal cap 20. The boat 21 is comprised entirely of quartz or silicon carbide. The boat 21 is comprised of a pair of end plates 22, 23 on the top and bottom and multiple holding members 24 (three pieces in the example in the figure) installed vertically between both end plates 22, 23. Many support grooves 25 are carved out so as to form openings mutually facing each other and formed equally spaced longitudinal intervals on each holding member 24. As shown in FIG. 2 and FIG. 3, an R chamfer section 27 is formed on the outer circumferential periphery (edge) of a support surface 26 formed from the upward facing surface of each support groove 25. The curved radius of the R chamfer section 27 is set to one millimeter or more. A semispherical protrusion. 28 is formed in the center of the support surface 26. The outer circumferential section of the wafer 1 are inserted in the support grooves 25 at mutually equal steps on the holding members 24. The multiple points (three points in the present embodiment) on the periphery of the lower surface of the wafer 1 are received and held by the protrusion 28 on the support surface 26. The protrusion 28 therefore comprises a support section to support the wafer. In their respective states while held by the support grooves 25, the multiple wafers 1 are arrayed while centered horizontally on the boat 21.

A heater unit 30 for heating the interior of the process tube 11 is installed concentrically on the outside of the outer tube 13 so as to enclose the periphery of the outer tube 13. The heater unit 30 heats the entire interior of the process tube 11 to a uniform or a preset temperature distribution. The heater unit 30 is installed perpendicularly to be supported by the casing 31 of the CVD apparatus. As shown in FIG. 1, the casing 31 is comprised of a heater unit chamber 32, and a standby chamber 33 for the boat 21 to await loading or unloading to the processing chamber 14. The standby chamber 33 is configured for the load-lock system (a system where an isolation valve such as a gate valve is used to isolate the processing chamber and the loading/unloading chambers, prevent the inflow of air to the processing chamber, and reduce disturbances such as from the temperature or pressure in order to stabilize the processing). An exhaust pipe 34 to exhaust the standby chamber 33, and a nitrogen gas supply pipe 35 to supply nitrogen gas to the standby chamber 33 as the purge gas are respectively connected to the side wall of the standby chamber 33 of the casing 31. The exhaust pipe 34 is connected to an exhaust device 41 by way of an exhaust line 45 to which a flow rate controller valve 46 and a pressure meter 47 are installed. The flow rate controller valve 46 is regulated by the control device 40. The pressure meter 47 sends the measurement results to the control device 40. The nitrogen gas supply pipe 35 is connected to a nitrogen gas supply source 60 by way of a nitrogen gas supply line 63 to which a flow rate controller 64 is installed. The flow rate controller valve 64 is regulated by the control device 40. A wafer loading/unloading opening is formed to be opened and closed by the gate valve on the other sidewall of the standby chamber 33. A boat elevator (not shown in drawing) is installed in the interior of the standby chamber 33 to raise and lower the seal cap 20.

The film-forming process for the IC manufacturing method of one embodiment of the present invention using the above-mentioned CVD apparatus when forming a doped polysilicon film on the wafer is described next.

In the wafer charging step where multiple wafers 1 are loaded into the boat 21, as shown in FIG. 1, with the boat 21 in standby in the standby chamber 33 the multiple wafers 1 are loaded into the boat 21 by the wafer transfer equipment. The air in the standby chamber 33 is purged at this time by nitrogen gas supplied from the nitrogen gas supply pipe 35. In other words, the control device 40 regulates the gas flow rate control valve 64 so that nitrogen gas from the nitrogen gas supply source 60 is supplied to the standby chamber 33 from the nitrogen gas supply pipe 35 via the nitrogen gas supply line 63. As shown in FIG. 6a, the pressure in the standby chamber 33 is maintained at atmospheric pressure (approximately 1013 hPa). This nitrogen gas purging of the standby chamber 33 prevents the generation of a naturally oxidized film on the wafers 1, and allows the wafer charging operation to be implemented under atmospheric pressure. The furnace opening gate valve 29 is closed at this time.

In the boat loading step where the boat 21 installed with a specified number of multiple wafers 1 is loaded into the processing chamber 14, after the furnace inlet 15 is opened by the furnace gate valve 29, the boat 21 is raised by the boat elevator, and is loaded from the furnace inlet 15 of inner tube 12 to the processing chamber 14. As shown in FIG. 2, the boat 21 is positioned in the processing chamber 14 while still supported by the seal cap 20 that seals the furnace inlet 15. During this boat loading, nitrogen gas is continually supplied from the nitrogen gas supply pipe 35 and the gas supply pipe 19 so that the pressure in the standby chamber 33 and the processing chamber 14 are respectively 200 Pa, and is respectively exhausted by the exhaust pipe 34 and the exhaust pipe 17. In other words, the control device 40 controls the nitrogen gas flow rate control valve 64 so that the flow rate of nitrogen gas from the nitrogen gas supply pipe 35 to the standby chamber 33 is regulated, and controls the flow rate control value 46 so that the standby chamber 33 is exhausted. As shown in FIG. 6a, the pressure in the standby chamber 33 is depressurized to 200 Pa and maintained. The control device 40 also controls the flow rate control valve 62 so that the flow rate of the nitrogen gas from the gas supply pipe 19 to the processing chamber 14 is regulated, and controls the flow rate control valve 43 so that the processing chamber 14 is exhausted. As shown in FIG. 6b, the processing chamber 14 is maintained at a pressure of 200 Pa. The furnace opening gate valve 29 is closed at this time and the furnace inlet 15 is sealed air-tight. The temperature of the processing chamber 14 is regulated to maintain the heat processing temperature (for example 530° C.). In this state, or in other words a state where the pressure of the standby chamber 33 and the processing chamber 14 have become equal, the standby chamber 33 and the processing chamber 14 are connected by opening the furnace opening gate valve 29, and boat loading is performed at a pressure of 200 Pa.

In the processing step in processing chamber 14 for processing the wafers 1 held by the boat 21, nitrogen gas continually flows from the gas supply pipe 19 so that the interior of the processing chamber 14 is maintained at the specified vacuum intensity (110 Pa), and is exhausted via the exhaust pipe 17. The control device 40 in other words, regulates the flow rate of nitrogen gas from the gas supply tube 19 to the processing chamber 14 by controlling the nitrogen gas flow rate control valve 62. The control device 40 also exhausts the processing chamber 14 by regulating the flow rate control valve 43. As shown in FIG. 6b, the processing chamber 14 is depressurized to 110 Pa. The process gas 36 is next supplied to the processing chamber 14 via the gas supply pipe 19 for depositing a doped polysilicon film 2 as the specified film on the surface of the wafer 1 by the thermal CVD method. In other words, the control device 40 regulates a film-forming gas flow rate control valve 52 to supply monosilane ($SiH_4$) gas and phosphine ($PH_3$) gas as a process gas 36 to the processing chamber 14 via the gas supply pipe 19. This supplied process gas 36 rises in the processing chamber 14 of the inner tube 12, flows out from the opening in the upper end, through the exhaust path 18 formed by the gap between the inner tube 12 and the outer tube 13 and is exhausted from the exhaust pipe 17.

When the preset processing time has elapsed, along with the seal cap 20 lowering and the furnace inlet 15 of processing chamber 14 opening, the wafer 1 group supported in the boat 21 is unloaded (boat unloading) to the external section of the process tube 11 from the furnace inlet 15. In this boat unloading step, as shown in FIG. 6, the pressure of the processing chamber 14 is increased to 200 Pa, approximately the same as the pressure in the standby chamber 33 maintained at 200 Pa.

In other words, the control device 40 regulates the flow rate of nitrogen gas from the gas supply tube 19 to the processing chamber 14 by controlling the nitrogen gas flow rate control valve 62, and regulates the flow rate control valve 43, as shown in FIG. 6b, to increase and maintain the pressure of the processing chamber 14 at 200 Pa. Performing the boat unloading step at a low pressure such as 200 Pa is extremely effective in preventing the formation of a natural oxidized film on the wafer 1 that has been processed.

In the wafer discharging step where the processed wafer 1 is removed from the boat 21 that was unloaded in the standby chamber 33, as shown in FIG. 6a, the air in the standby chamber 33 is purged by nitrogen gas supplied from the nitrogen gas supply pipe 35. In other words, by regulating the nitrogen gas flow rate control valve 64 with the control device 40, nitrogen gas from the nitrogen gas supply source 60 is supplied from the nitrogen gas supply pipe 35 to the standby chamber 33 via the nitrogen gas supply line 63. As shown in FIG. 6a, the pressure in the standby chamber 33 is increased to atmospheric pressure and is maintained there. The processed wafer 1 that has reached a high temperature can be cooled by nitrogen gas purging of the standby chamber 33. When the temperature of this processed wafer 1 has fallen to a temperature that allows handling by the transfer device, the processed wafer 1 group is removed from the boat 21 by the wafer transfer device. The air in the standby chamber 33 is purged by nitrogen gas at this time, so the formation of a natural oxidized film on the processed wafer 1 is prevented, and the task of wafer discharge can be performed under atmospheric pressure. The film-forming process is repeated from here onward by repeating each of the above steps.

In the above described film-forming process, during the boat loading of the wafer 1 into the processing chamber 14 with the temperature maintained at the process temperature, the temperature of the wafer 1 rises on the periphery on the side nearer the heater unit 30 and rises later in the center section on the side farther away from the heater unit. Due to the relation between the temperature differential within the surface of this wafer 1 and the weight of the wafer 1 itself, a phenomenon occurs where the wafer 1 curves into a concave shape (shape where the center section drops and periphery rises). Along with the curvature of the wafer 1, the support surface 26 of the support groove 25 of the boat 21 and the supported surface on the periphery on the lower surface of the wafer 1 rub against each other, causing the weak film on the boat 21 formed in the previous film-forming process to peel. The peeled film becomes particles that fall from the support surface 26 of the support groove 25, and adhere to the upper surface which is the surface where the IC is fabricated on the wafer 1 directly below so that these particles cause lower productivity in the IC manufacturing method.

However, in the present embodiment, the wafer 1 is supported above the support surface 26 by the protrusion 28 formed in the center section of the support surface 26 of the support groove 25 so that even if peeling of the film occurs due to friction between the supported surface of the wafer 1 and the protrusion 28 of the boat 21, the particles resulting from the peeling are prevented from dropping onto the wafer because the particles are caught by the support surface 26 of the boat 21. In other words, even if peeling of the film occurs due to friction between the supported surface of the wafer 1 and the protrusion 28 on the boat 21, the particles resulting from the peeling are prevented from attaching to the upper surface directly below which is the surface on the wafer 1 where the IC is fabricated. Consequently a drop in productivity in the IC manufacturing method due to the generation of particles can be prevented. The support surface 26 therefore is a receiving section for catching the particles generated by the protrusion 28 which is the support section supporting the wafer 1.

FIG. 4 is a graph showing the interrelation of the shape of the support surface and the increased quantity of particles. Here, the increased particle quantity signifies the increase in particles after processing versus the particle quantity prior to processing. In FIG. 4, the vertical axis is the increase in the number of particles of 0.16 micrometers, while the horizontal axis shows the case of the prior art without the protrusion, and the case of the present embodiment possessing the protrusion. In each case, the TOP bar indicates the increased number of particles in the top section of the boat, and the BOTTOM bar indicates the increased number of particles in the bottom section of the boat. The test conditions were identical for each case. The temperature in the processing section 14 in the boat loading step was set to 530° C. The pressure in the standby chamber 33 and the processing chamber 14 was set to 200 Pa. As can be understood from FIG. 4, in the present embodiment, the increase in particle quantity for both the top and bottom sections was reduced to less than 20 particles.

Figure 5A:
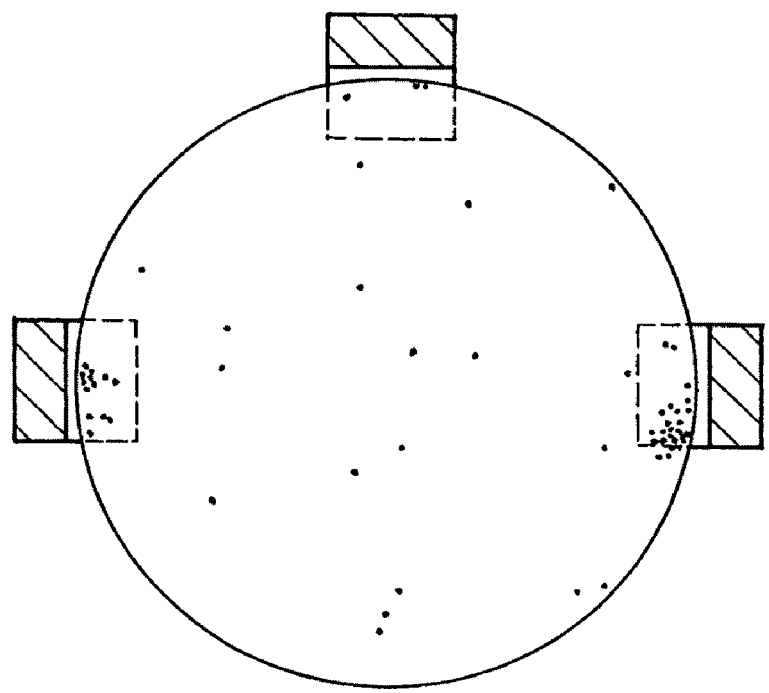
FIGS. 5a and 5b are drawings showing the particle distribution.
Figure 5B:
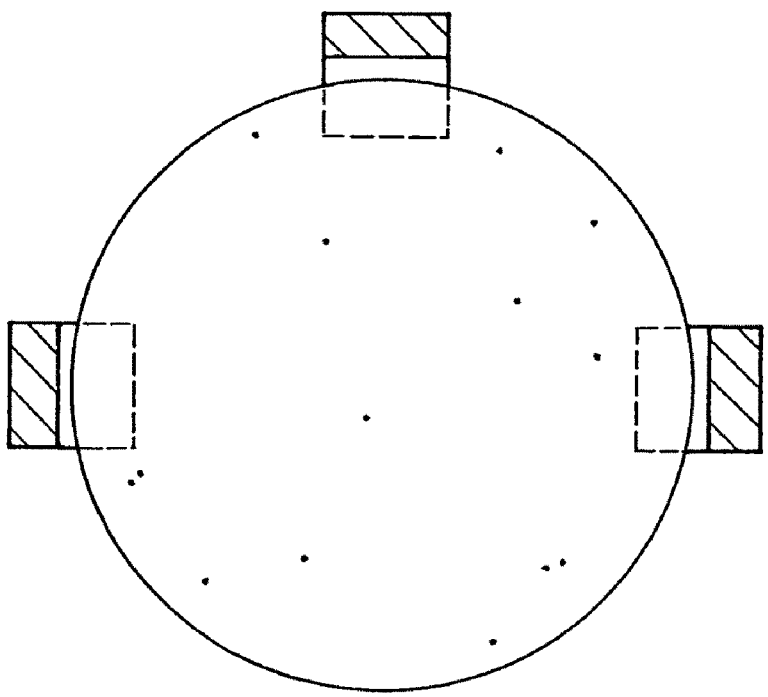

FIGS. 5a and 5b are drawings showing the particle distribution. FIG. 5a is a drawing showing the case of the prior art with no protrusion. FIG. 5b is the case of the embodiment, possessing a protrusion. In the case of the prior art not having a protrusion as shown in FIG. 5a, there are particles present unevenly distributed in the section corresponding to the holding member 24. In contrast, in the case of the embodiment possessing the protrusion shown in FIG. 5b, the particles are not unevenly distributed in the section corresponding to the holding member 24, and are spread over the entire section. This example demonstrates that the particles are being caught by the support surface 26 and are not dropping onto the upper surface of the wafer 1.

However, in the boat loading step, the quantity of particles generated becomes larger, the lower the pressure in the standby chamber and the processing chamber. The quantity of particles generated becomes smaller as the pressure becomes higher. In the case in FIG. 4, the pressure in the standby chamber 33 and the processing chamber 4 in the boat loading step is set low at 200 Pa, however the number of increased particles was limited to 20 or less. Therefore, the pressure in the standby chamber 33 and the processing chamber 14 in the boat loading step for the embodiment is preferably set to 200 Pa or higher.

However, setting the pressure in the standby chamber 33 and the processing chamber 14 high excessively in the boat loading step, causes a long pressure adjustment time due to the large differential versus the process pressure in the processing step (110 Pa in the present embodiment). Also, setting the pressure too high does not allow adequately suppressing the increase in natural oxidized film. When the pressure in the boat loading step is for example set to atmospheric pressure (approximately 1013 hPa) which is a comparatively high pressure, time is required to adjust the pressure which exerts adverse effects on the throughput and moreover, the natural oxidized film cannot be adequately suppressed. Therefore a pressure lower than atmospheric pressure, for example 3000 Pa or less is preferable for the standby chamber 33 and the processing chamber 14 in the boat loading step. If set to a pressure lower than atmospheric pressure, preferably 3000 Pa or less, then the time needed for pressure adjustment from boat loading step to the process step can be set to the time that will not exert an effect on throughput. Another benefit is that the generation of the natural oxidizing layer can be adequately suppressed. In other words, the pressure in the standby chamber 33 and the processing chamber 14 in the boat loading step should be 200 Pa or more and below atmospheric pressure, and preferably is set to 200 Pa or more and 3000 Pa or less.

The above described embodiment yields the following effects.

(1) The wafer is supported in an upward state from the support surface by the protrusion formed in the center of the support surface of the support groove so that even if peeling of the deposited film occurs due to the friction generated between the protrusion on the boat and the supported surface of the wafer, the particles resulting from the peeling are caught by support surface of the boat and therefore the falling of particles onto the wafer can be prevented.

(2) Even if peeling occurs due to friction occurring between the protrusion on the boat and the supported surface of the wafer, the particles resulting from the peeling can be prevented from adhering to the upper surface of the wafer directly below on which the IC is formed so that a drop in production in the IC manufacturing method due to the generation of particles can be prevented.

(3) By setting the pressure in the standby chamber and the processing chamber in the boat loading step to 200 Pa or more and below atmospheric pressure, and preferably setting it between 200 Pa or more and 3000 Pa or less, the adjustment time required during pressure adjustment from boat loading step to the process step can be set to the time that will not exert effects on the throughput, the generation of a natural oxidizing layer can be adequately suppressed so that a drop in the throughput is prevented and the formation of a natural oxidizing layer can definitely be prevented.

Figure 7:
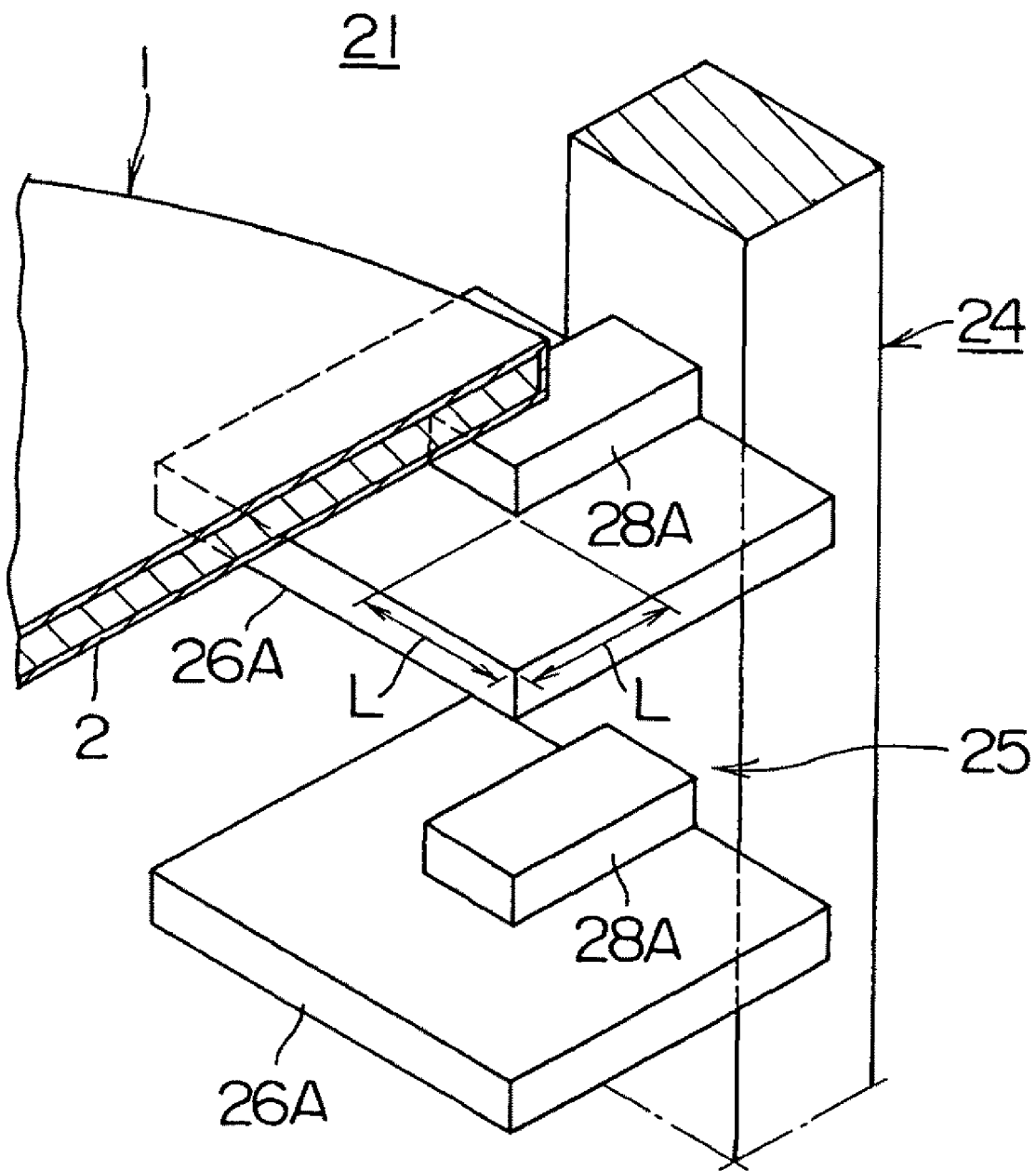
FIG. 7 is a perspective view showing the support groove section of the boat for the CVD apparatus of the second embodiment of the present invention.
Figure 8:
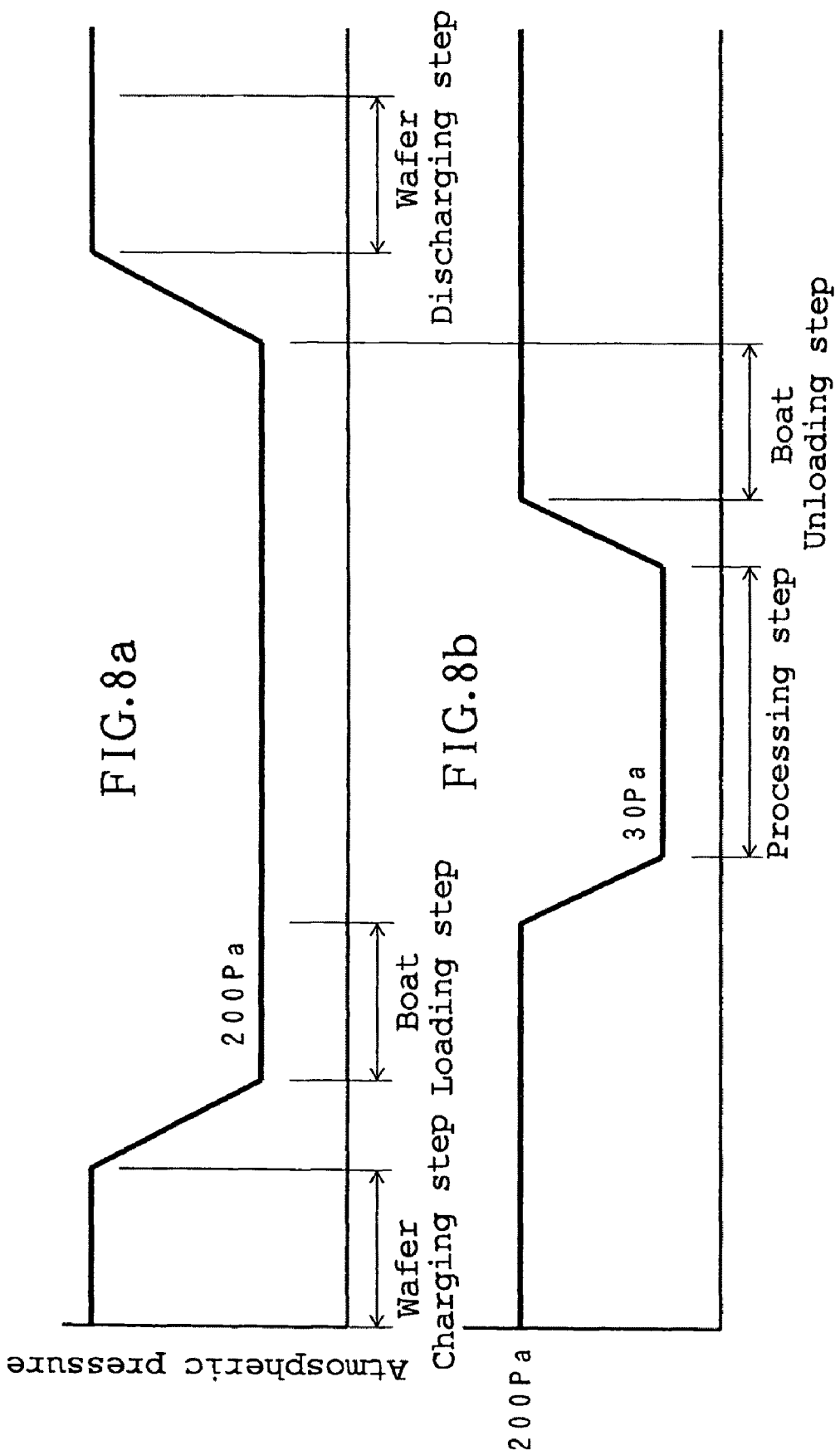
FIGS. 8a and 8b are timing charts showing the pressure in the film forming process for the IC manufacturing method of the second embodiment of the present invention.
Figure 9:
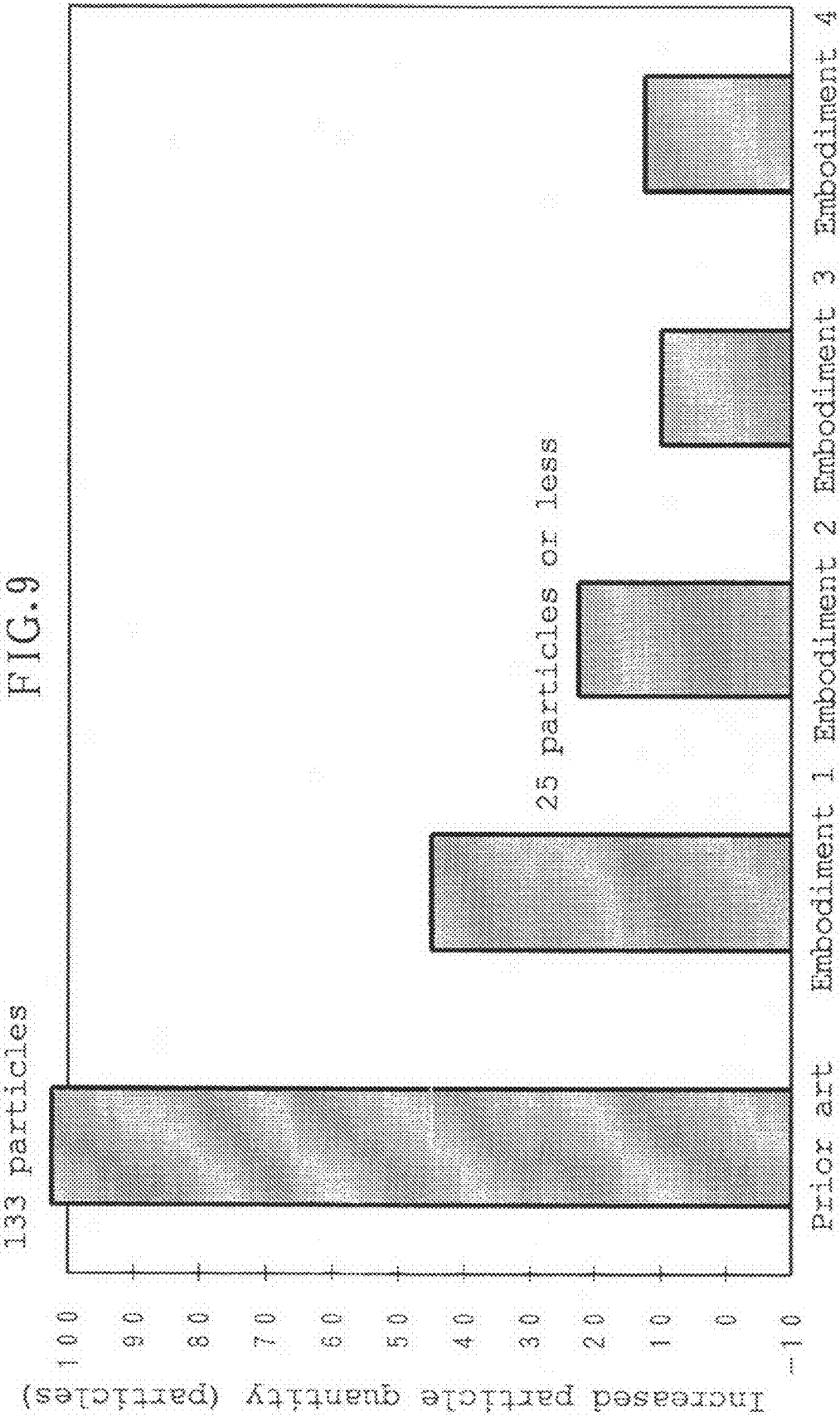
FIG. 9 is a graph showing the relation of an increased particle quantity to the size of the receiving section.
Figure 10:
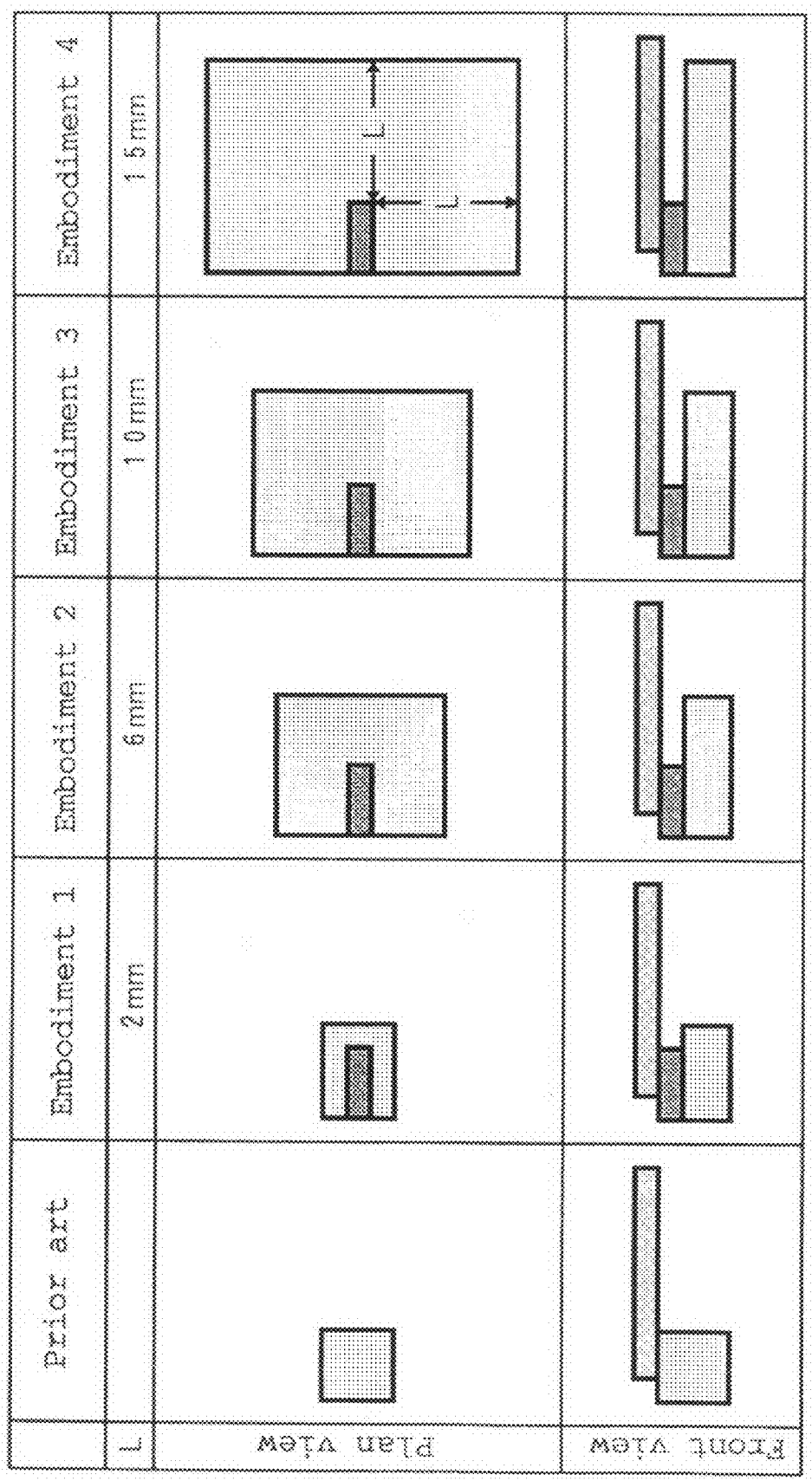
FIG. 10 is a drawing comparing the respective receiving sections used in the experiment in FIG. 9.
Figure 11A:
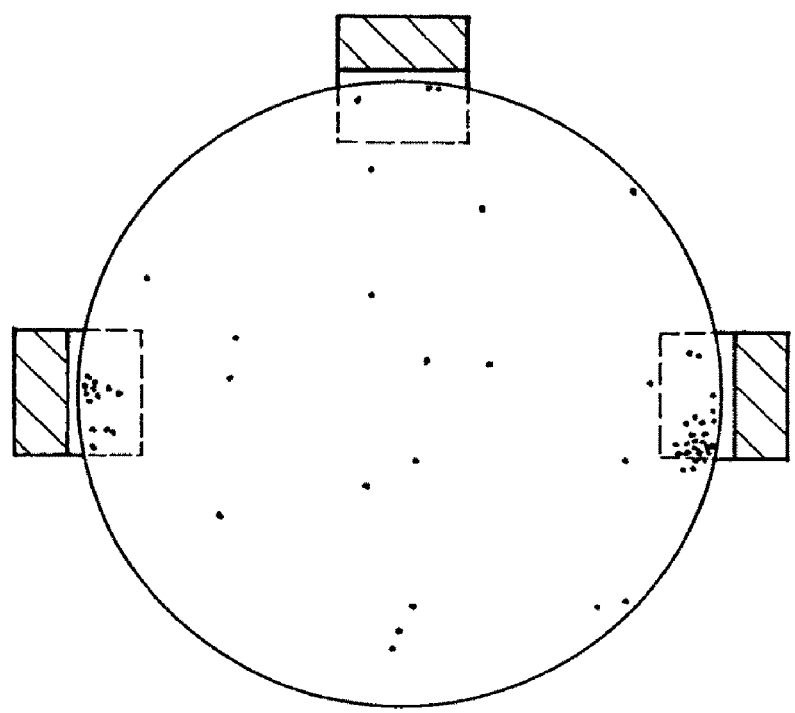
FIGS. 11a and 11b are drawings showing the particle distribution.
Figure 11B:
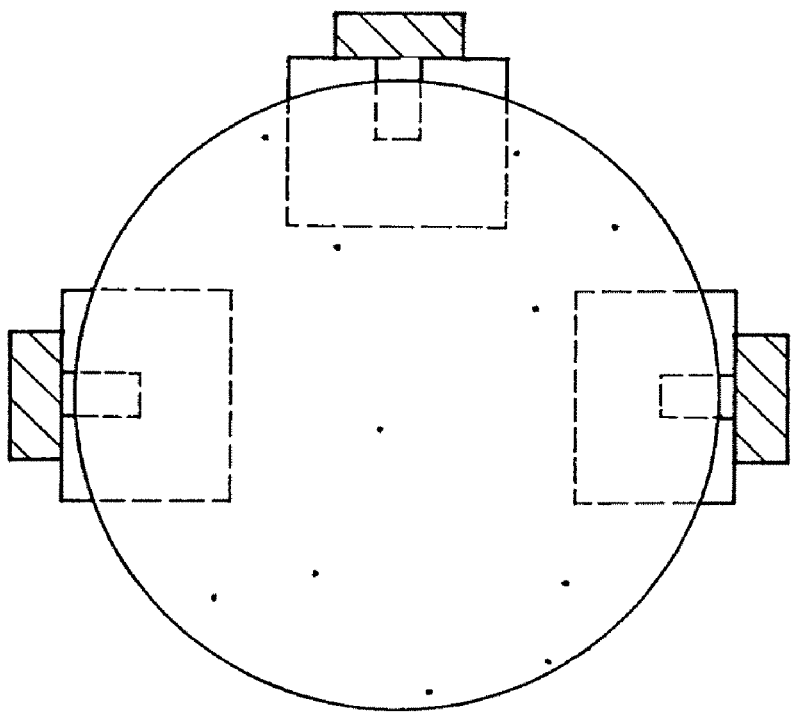

FIG. 7 is a perspective view showing the support groove section of the boat for the CVD apparatus of the second embodiment of the present invention. FIG. 8 is a timing chart showing the pressure in the film forming process for the IC manufacturing method of the second embodiment of the present invention. FIG. 9 is a graph showing the relation of an increased particle quantity to the size of the receiving section. FIG. 10 is a drawing comparing the respective receiving sections used in the experiment. FIGS. 11a and 11b are distribution graphs showing the effect on reducing particle.

In this embodiment as shown in FIG. 7, the support section 28A that contacts and supports the bottom edge of the wafer 1 on the support groove 25 section in the holding member 24 of the boat 21 is provided horizontally inwardly along the radius of the wafer 1. Below the support section 28 A is the receiving section 26A for catching the particles generated by the support section 28A. The receiving section 26A is formed horizontally inwardly along the radius of the wafer 1 so as to extend outwards in three directions from the outer periphery of the support section 28A, in other words, the outer periphery of the support section 28A which is not in contact with the main pillar section of the holding member 24. The support section 28A uses the same material as the holding member 24 and is formed in a right-angled parallel piped shape as seen in a plan view. The receiving section 26A uses the same material as the support section 28A and is formed in a flat plate in the shape of a square as seen from a plan view. The extension quantity L (distance L from the edge of the support section 28A shown in FIG. 7 to the edge of the receiving section 26A) or in other words the distance that the receiving section 26A extends outwards in three directions from the outer periphery of the support section 28A not contacting the main pillar section of the holding member 24, is six millimeters or more, and preferably is set between 6 and 15 millimeters.

The film-forming process for the IC manufacturing method of the second embodiment of the present invention using the CVD apparatus containing the boat structured as explained above, is described next in FIG. 8 using the forming of a silicon nitride ($Si_3N_4$) film on the wafer as an example.

In the wafer charging step where multiple wafers 1 are loaded in the boat 21, as shown in FIG. 8a, the pressure in the standby chamber 33 is maintained at atmospheric pressure (approximately 1013 hPa) by purging the air in the standby chamber 33 with nitrogen gas. This nitrogen gas purge of the standby chamber 33 prevents the formation of a natural oxidized layer on the wafers 1, and the wafer charging task is performed under atmospheric pressure.

In the boat loading step where the boat 21 installed with a specified number of wafers 1 is loaded into the processing chamber 14, as shown in FIG. 8a, the pressure in the standby chamber 33 is depressurized to 200 Pa and maintained there. The pressure in the processing chamber 14 is also maintained at 200 Pa as shown in FIG. 8b. The temperature in the processing chamber 14 at this time is regulated so as to maintain 750 degree. C. of the heat treatment temperature, however this temperature drops somewhat when the boat 21 is loaded inside.

In the processing step for processing the wafer 1 group supported in the boat 21, as shown in FIG. 8b, the pressure in the processing chamber 14 is depressurized to 30 Pa. In this case, the pressure in the standby chamber 33 is maintained at 200 Pa. Next, dichlorosilane ($SiH_2Cl_2$) gas and ammonia ($NH_3$) as the process gas are supplied to the processing chamber 14 and a silicon nitride ($Si_3N_4$) film is deposited on the wafer 1. In the boat unloading step after the preset processing time has elapsed, as shown in FIG. 8a, the pressure of the processing chamber 14 is increased to 200 Pa, approximately the same as the pressure in the standby chamber 33 maintained at 200 Pa. Performing the boat loading step while maintaining a low pressure such as 200 Pa is extremely effective in preventing the formation of a natural oxidized film on the wafer 1 that has been processed.

In the wafer discharging step where the processed wafer 1 is removed from the boat 21 that was loaded in the standby chamber 33, as shown in FIG. 8a, the air in the standby chamber 33 is purged by nitrogen gas so that the pressure in the standby chamber 33 is increased to atmospheric pressure and maintained there. The processed wafer 1 that has reached a high temperature can be force cooled by nitrogen gas purging of the standby chamber 33. When the temperature of this processed wafer 1 has fallen to a temperature that allows handling by the transfer device, the processed wafer 1 group is removed from the boat 21 by the wafer transfer device. The air in the standby chamber 33 is purged by nitrogen gas at this time so the formation of a natural oxidized film on the processed wafer 1 is prevented, and the task of wafer discharge can be performed under atmospheric pressure. The film-forming process is repeated from here onward by repeating each of the above steps.

In the above described film-forming process, during the loading of the boat with the wafers 1 into the processing chamber 14 maintained at the process temperature, the temperature of the wafer 1 rises on the periphery on the side nearer the heater unit 30 and rises later in the center section on the side farther away from the heater unit. Due to the relation between the temperature differential within the surface of the wafer 1 and the weight of the wafer 1 itself, a phenomenon occurs where the wafer 1 curves into a concave shape (shape where the center section drops and periphery rises). Along with the curvature of the wafer 1, the support section 28A of the boat 21 and the supported surface on the periphery on the bottom surface of the wafer 1 rub against each other, causing the weak film on the boat 21 formed in the previous film-forming process to peel and drop. The dropped particles are caught by the receiving section 26A below the support section 28A so that the particles do not drop onto the wafer. In other words, even if peeling of the film occurs due to friction between the supported surface of the wafer 1 and the support section 28A of the boat 21, the particles resulting from the peeling are prevented from attaching to the upper surface directly below which is the surface on the wafer 1 where the IC is fabricated. Consequently a drop in productivity in the IC manufacturing method due to the generation of particles can be prevented.

FIG. 9 is a graph showing the relation of an increased particle quantity to the size of the receiving section. Here, the increased particle quantity signifies the increase in particles after processing versus the particle quantity prior to processing. In FIG. 9, the vertical axis is the increase in the number of particles in excess of 0.2 micrometers, while the horizontal axis shows the example of the prior art, and the example present embodiment as shown in FIG. 10. The test conditions were identical for each case. The temperature in the processing chamber 14 in the boat loading step was set to 750° C. The pressure in the standby chamber 33 and the processing chamber 14 was set to 200 Pa.

FIG. 9 shows that though the increased particle quantity was 133 particles in the case of the prior art, the increased particle quantity for the first embodiment, second embodiment, third embodiment, and fourth embodiment were respectively 45 particles, 22 particles, 10 particles, and 11 particles and were in all cases 45 particles or less. In other words, the increased particle quantity can be reduced to 45 particles or less by setting the extension quantity L from the corner on the side of the tip of the support piece 28A of the receiving section 26A to two millimeters or more. Also, the increased particle quantity can be reduced to 20 particles or less if the extension quantity L of the receiving section 26A is set to six millimeters or more. Setting the extension quantity L of the receiving section 26A to ten millimeters or more can reduce the increased particle quantity to about 10 particles or less. As clearly shown by comparing the third embodiment and the fourth embodiment, the particle reduction effect is saturated in the case of the fourth embodiment where the extension quantity L of the receiving section 26A is 15 millimeters. In other words, the extension quantity L from the outer edge of the support section 28A of the receiving section 26A is preferably set from 2 to 15 millimeters. Even more preferable is setting the extension quantity L from 6 to 15 millimeters.

FIGS. 11a and 11b are drawings showing the particle distribution. FIG. 11a shows the example of the prior art of FIG. 10 without the receiving section. FIG. 11b shows the case of the fourth embodiment of FIG. 10. In the case of the prior art shown in FIG. 11a, there are particles present that are unevenly distributed in the section corresponding to the holding member 24. In contrast, in the case of the fourth embodiment shown in FIG. 11b, the particles are not unevenly distributed in the section corresponding to the holding member 24, and are spread over the entire section. This example demonstrates that the particles are being caught by the receiving section 26A and therefore are probably not dropping onto the upper surface of the wafer 1.

The present embodiment as described above therefore also renders the same effect at the previous embodiment.

Figure 12B:
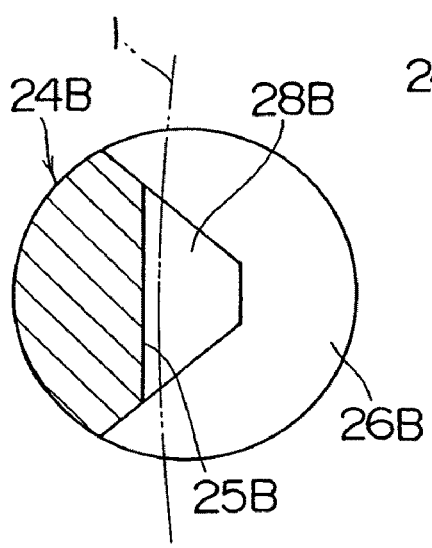
FIGS. 12a, 12b and 12c are drawings showing a section of the support groove on the boat of the CVD apparatus of the third embodiment of the present invention.
Figure 12A:
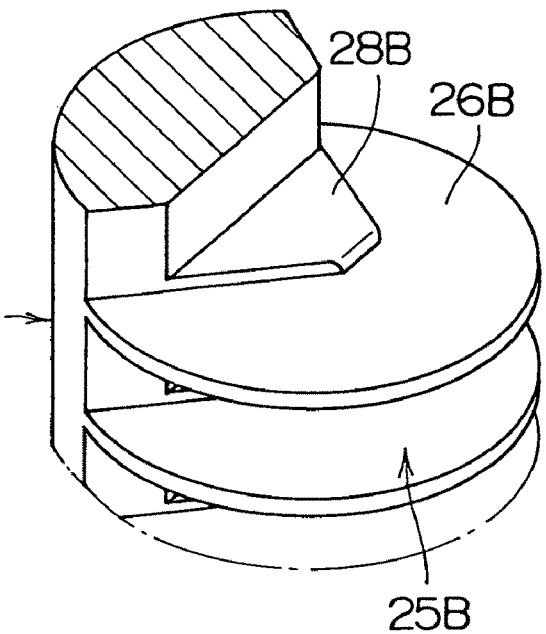
Figure 12C:
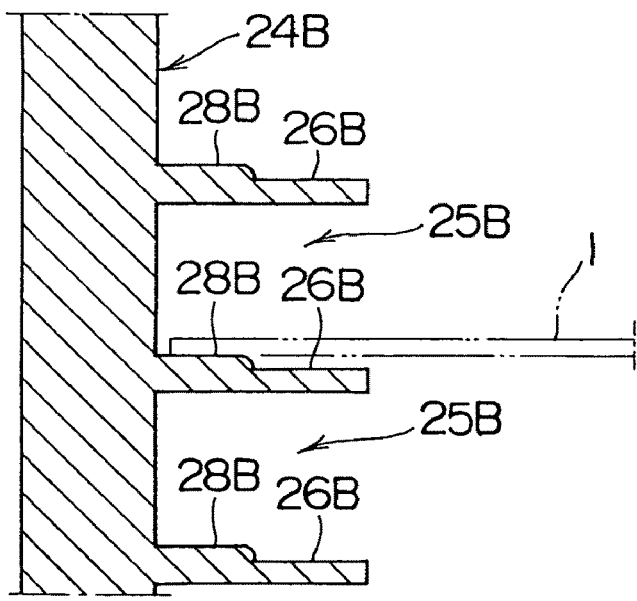

FIGS. 12a, 12b and 12c are drawings showing a portion of the support groove on the boat for the CVD apparatus of the third embodiment of the present invention. FIG. 12a is a perspective view. FIG. 12b is a plan cross sectional view. FIG. 12C is a frontal cross sectional view.

In this embodiment, the boat is comprised of multiple holding members, in this case three members, the same as in the first embodiment and the second embodiment. As shown in FIGS. 12a, 12b and 12c, the holding member 24B of the boat 21 of the present embodiment is a columnar shape. The support groove 25B is formed by machining on the section towards the center of the wafer 1 on the outer circumferential surface of the holding member 24B. The support section 28B contacting and supporting the lower surface of the wafer 1 on the support groove 25B is formed facing inwards horizontally along the radial direction of the wafer 1. The receiving section 26B for catching the particles generated on the support section 28B is formed across the entire edge of the support section 28B at a position lower than the support section 28B (below the support section 28B). The support section 28B has a mountain shape as seen from a plan view. More accurately, the support section 28B has a flat trapezoidal shape. The peak or in other words, the upper base (shorter side) of this trapezoid points towards the center of the wafer 1 and the lower section of the mountain or in other words the lower base (longer side) of the trapezoid is formed facing side opposite the center side of the wafer 1. In other words, the width of the support section 28B shape becomes narrower as it approaches the center of the wafer 1 from the columnar section of the holding member 24B shown by the hatch marks in FIG. 12b. The upper base section of the trapezoidal shape of the support section 28B where the wafer is placed is roundly chamfered. The support section 28B of trapezoidal shape can be formed at the same time that the support groove 25B is being cut-machined. The shape of the receiving section 26B as seen from a plan view, is a shape cut the cross sectional shape of a section of the column shown by the hatching in FIG. 12b and the trapezoidal shape of the support section 28B from the circular cross section of the receiving section 26B of the holding member 24B. The receiving section 26B is continuously formed from the section of the column of the holding member 24B to the edge of the support section 28B (two oblique sides and upper base of the trapezoid). The receiving section 26B can be formed at the same time that the support section 28B and the support groove 25b on the holding member 24B is being cut-machined.

Besides the effects of the previously described embodiments, the present embodiment also yields the following effects. The number of machining steps can be reduced since the receiving section 26B and the support section 28B can be formed simultaneously just by cut-machining the support groove 25B on the holding member 24B. The number of parts can also be reduced by integrating the support section 28B, the receiving section 26B and the holding member 24B into one piece, and therefore the cost of CVD apparatus production can be lowered as well as the boat. The cut-machining of the holding member 24B is simple since the support section 28B is a plate shaped trapezoid as seen from a plan view and formed so that the width narrows towards the center of the wafer 1. Further, the mechanical strength of the holding member 24B is maintained and the contact surface area with the wafer can therefore be reduced. In other words, not only is the boat easy to machine, but the boat is also maintained at an ample structural strength while supporting the weight of the wafer, and at the same time the extent of contamination due to contact with the rear surface of the wafer can be lowered by reducing the size of the contact surface area with the wafer.

The present invention is in no way or manner restricted by the embodiments and variations of all types that do not depart from the overall concept may of course be implemented.

The present invention for example is not limited to a film-forming process for doped polysilicon film or silicon nitride film, and may also be applied to non-doped polysilicon film, non-doped amorphous silicon film, doped amorphous silicon film, silicon oxide film, and further may be applied to film-forming process implemented by CVD apparatus for such as metallic oxidized films such as tantalum oxide film, zirconium oxide film, etc. Particularly, the present invention is preferable when forming a film by CVD, since the adverse effects from peeling of the film deposited on the support section of the boat in the prior process can be prevented.

The semiconductor manufacturing apparatus for implementing the properties of the semiconductor device manufacturing method are not limited to the batch mode vertical hot-wall depressurization CVD apparatus having a process tube comprised of an outer tube and an inner tube, and may be other CVD apparatus such as a single wafer CVD apparatus or a CVD apparatus comprised of a process tube having only an outer tube, and may be a heat treatment apparatus for implementing all types of thermal processes.

The embodiments of the present invention described the implementing of wafer processing but processing may also be performed on photo masks, printed circuit boards, liquid crystal panels, compact disks and magnetic disks, etc.

INDUSTRIAL APPLICABILITY

The present invention as described above, can prevent a drop in productivity due to particles from the supported surface of a substrate in a depressurized state.

What is claimed is:

1. A substrate support member for supporting substrates during heat treatment, wherein said substrate support member comprises multiple holding members installed vertically, each of said holding members has multiple support grooves, each of said support grooves contains a support section to contact a substrate, and a receiving section formed, in a flat plate with a rectangular shape as seen from a plan view, below said support section and extending outwards from a section of the outer periphery of said support section, and said receiving section extends outwards to 6 mm or more from a section of the outer periphery of said support section.

2. A substrate support member according to claim 1, wherein said receiving section extends outwards between 6 mm and 15 mm from the section of the outer periphery of said support section.

3. The substrate support member according to claim 1, wherein said receiving section extends outwards to 10 mm or more from the section of the outer periphery of said support section.

4. The substrate support member according to claim 1, wherein said receiving section extends outwards between 10 mm and 15 mm from the section of the outer periphery of said support section.

5. The substrate support member according to claim 1, wherein said support section is formed in a right-angled parallel-piped shape with a rectangular shape as seen from a plan view, and said receiving section is formed in a flat plate with a rectangular shape as seen from a plan view.

6. The substrate support member according to claim 1, wherein said support section is arranged inside the outer periphery of said receiving section as seen from a plan view.

7. A substrate support member for supporting substrates during heat treatment, wherein said substrate support member comprises multiple holding members installed vertically, each of said holding members has multiple support grooves, each of said support grooves contains a support section to contact a substrate, and a receiving section, formed in a flat plate below said support section and extending outwards from a section of the outer periphery of said support section, said support section is formed in a flat plate with a trapezoid as seen from a plan view, and the shorter side of the pair of parallel sides of the trapezoid faces the center of said substrate.

8. The substrate support member according to claim 7, wherein said support section is formed in a flat plate with a trapezoid as seen from a plan view, and a shorter side of a pair of parallel sides of the trapezoid faces the center of said substrate, and a longer side of a pair of parallel sides of the trapezoid faces side opposite to the center of said substrate.

9. The substrate support member according to claim 7, wherein said support section is arranged inside the outer periphery of said receiving section as seen from a plan view.

10. The substrate support member according to claim 7, wherein said receiving section is formed as a flat plate with a circular shape as seen from a plan view.

11. The substrate support member according to claim 7, wherein each of said holding members has a columnar shape.

12. A substrate support member for supporting substrates during heat treatment, wherein said substrate support member comprises multiple holding members installed vertically, each of said holding members has multiple support grooves, each of said support grooves contains a support section to contact a substrate, and a receiving section formed in a flat plate below said support section and extending outwards from a section of the outer periphery of said support section, said support section is formed in a flat plate with a trapezoidal shape as seen from a plan view, and the width of said support section becomes narrower as it approaches the center of said substrate.

13. The substrate support member according to claim 12, wherein said support section is arranged inside the outer periphery of said receiving section as seen from a plan view.

14. The substrate support member according to claim 12, wherein said receiving section is formed as a flat plate with a circular shape as seen from a plan view.

15. The substrate support member according to claim 12, wherein each of said holding members has a columnar shape.

* * * * *